(12) United States Patent
Divakauni et al.

(10) Patent No.: US 6,544,837 B1
(45) Date of Patent: Apr. 8, 2003

(54) SOI STACKED DRAM LOGIC

(75) Inventors: Ramachandra Divakauni, Somers, NY (US); Mark C. Hakey, Fairfax, VT (US); William H.-L. Ma, Fishkill, NY (US); Jack A. Mandelman, Stormville, NY (US); William R. Tonti, Essex Junction, VT (US)

(73) Assignee: International Business Machines Corporation, Armonk, NJ (US)

( * ) Notice: Subject to any disclaimer, the term of this patent is extended or adjusted under 35 U.S.C. 154(b) by 0 days.

(21) Appl. No.: 09/527,743

(22) Filed: Mar. 17, 2000

(51) Int. Cl.[7] .............................................. H01L 21/46
(52) U.S. Cl. ...................... 438/243; 438/455
(58) Field of Search ................... 438/455, 456, 438/459, 243

(56) References Cited

U.S. PATENT DOCUMENTS

| | | | |
|---|---|---|---|
| 5,055,898 A | 10/1991 | Beilstein, Jr. et al. | 257/301 |
| 5,266,511 A | * 11/1993 | Takao | 438/401 |
| 5,426,072 A | 6/1995 | Finnla | 438/107 |
| 5,478,408 A | 12/1995 | Mitani et al. | 148/33.3 |
| 5,654,220 A | 8/1997 | Leedy | 438/25 |
| 5,670,387 A | 9/1997 | Sun | 438/155 |
| 5,674,758 A | 10/1997 | McCarthy | 438/26 |
| 5,759,889 A | 6/1998 | Sakao | 438/241 |
| 5,770,511 A | 6/1998 | Matsumoto et al. | 438/406 |
| 5,770,875 A | 6/1998 | Assaderaghi et al. | 257/301 |
| 5,792,685 A | 8/1998 | Hammerl et al. | 438/243 |
| 5,793,115 A | 8/1998 | Zavracky et al. | 257/777 |
| 5,801,089 A | 9/1998 | Kenney | 438/589 |
| 5,807,783 A | 9/1998 | Gaul et al. | 438/406 |
| 5,882,897 A | 3/1999 | Srikrishnan | 438/458 |
| 5,888,854 A | 3/1999 | Morihara | 438/155 |
| 5,889,302 A | 3/1999 | Liu | 257/315 |
| 5,893,735 A | 4/1999 | Stengl et al. | 438/243 |
| 5,894,152 A | 4/1999 | Jaso et al. | 257/347 |
| 5,914,510 A | * 6/1999 | Hieda | 257/301 |

OTHER PUBLICATIONS

M. Bruel et al., "Smart Cut': A Promising New SOI Material Technology", Proceeding 1995 IEEE International SOI Conference, Oct. 1995.*

Stanley Wolf Ph.D. in Silicon Processing for the VLSI Era, vol. 3: The Submicron MOSFET, Lattice Press, 1995, pp. 482–485.*

Stanley Wolf Ph.D. and Richard N. Tauber Ph.D. in Silicon Processing for the VLSI Era, vol. 1: Process Technology, Lattice Press, 1986, pp. 209–210.*

* cited by examiner

Primary Examiner—Olik Chaudhuri
Assistant Examiner—William M. Brewster
(74) Attorney, Agent, or Firm—Whitman, Curtis & Christofferson, P.C.; Mark F. Chadurjian

(57) ABSTRACT

A composite, layered, integrated circuit formed by bonding of insulator layers on wafers provides for combination of otherwise incompatible technologies such as trench capacitor DRAM arrays and high performance, low power, low voltage silicon on insulator (SOI) switching transistors and short signal propagation paths between devices formed on respective wafer layers of a chip. In preferred embodiments, an SOI wafer is formed by hydrophilic bonding of a wafer over an integrated circuit device and then cleaving a layer of the second wafer away using implanted hydrogen and low temperature heat treatment. Further wafers of various structures and compositions may be bonded thereover and connections between circuit elements and connection pads in respective wafers made using short vias that provide fast signal propagation as well as providing more numerous connections than can be provided on chip edges.

12 Claims, 4 Drawing Sheets

SOI STACKED DRAM LOGIC

BACKGROUND OF THE INVENTION

1. Field of the Invention

The present invention generally relates to semiconductor integrated circuits and, more particularly, to high capacity dynamic random access memories including high performance transistors in support circuitry thereof and other types of devices having differing circuit element requirements and to testing and burn-in thereof.

2. Description of the Prior Art

As the processing power of microprocessors has increased and cycle times reduced, higher capacity memories with more rapid access time have been demanded. Accordingly, dynamic memories have been developed with storage cells requiring reduced area or footprint such that memory chips having a capacity of a gigabit or more can be foreseen. Such storage cells are often formed by lining trenches in a chip of doped semiconductor with an insulator and filling the remainder of the trench with doped polysilicon to form an array of capacitors having a common electrode formed by the chip. A storage cell of such an array is generally referred to as a trench capacitor.

Substantial circuitry for accessing particular storage cells and sensing the charge stored therein is also required such as decoders, bit line drivers and sense amplifiers collectively referred to as "support circuits". It is desirable and, at the present state of the art, substantially necessary to form support circuits on the same chip as the memory array. However, the support circuitry requires substantial chip area which is thus not available for formation of memory cells. Also, larger arrays imply longer word and bit lines which are necessarily of increased capacitance while storage cell size reduction tends to, decrease capacitance of each storage cell. A reduction of the ratio of these capacitances reduces the voltage available to sense amplifiers and increases the criticality of sense amplifier operating margins.

Higher switching speeds and reduced cycle times have required new transistor technologies as well as high integration densities to reduce signal propagation time. At the present time, high performance transistors are often formed using silicon-on-insulator (SOI) technology because of the well-known device advantages of SOI such as reduced junction capacitance, latch-up immunity, improved isolation, steeper sub-Vt slope, reduced back-bias sensitivity and the like. Transistors fabricated using SOI technology provide particularly low power dissipation and high speed operation at low voltages (e.g. less than 1.5 volts).

A SOI wafer will typically comprise a relatively thin layer of silicon formed on an insulator which is, in turn supported by a bulk silicon wafer in order to withstand processing to form the active devices. The bulk silicon wafer has no electrical function and is fully insulated from any active devices which may be formed. SOI wafers may be formed in different ways including lamination of oxide-covered substrates oxide-to-oxide by heat treatment.

A leading process for constructing an SOI wafer is disclosed in "'Smart Cut'; A Promising New SOI Material Technology" by M. Bruel et al.; Proceedings 1995 IEEE International SOI Conference; October, 1995, which is hereby fully incorporated by reference. This process includes the steps of implanting hydrogen into a first silicon wafer capped with oxide, room temperature hydrophilic bonding to a second wafer of bare silicon or oxide capped silicon, heat treatment of the bonded wafers at 400° C.–600° C. to cleave the wafers at a location within the silicon of the first wafer leaving the oxide cap(s) embedded and covered by a very thin layer of monocrystalline silicon from the first wafer bonded to and supported by the second wafer. The wafer is completed by a final chemical-mechanical polish step to reduce the surface roughness to a small fraction of a nanometer.

However, SOI transistors and trench capacitors are not compatible and cannot be easily integrated on the same chip. For example, voltages required for testing and burn-in of trench capacitors is greater than the breakdown voltage of the thin gate oxide of high performance field effect transistors. Further, the active device layer of SOI wafers is too thin to provide adequate capacitance at currently feasible minimum lithographic feature sizes and forming a trench through the insulator of an SOI wafer or chip would compromise the electrical isolation thereof. Moreover, the thermal budget required to form trench capacitors and node interconnections greatly exceeds the desired heat budget for forming high speed, low voltage logic switching devices in SOI.

Another problem involving on-chip capacitances required in increasing numbers of types of integrated circuits is the decoupling capacitance which is required in logic circuits operating at low voltage and clock frequencies greater than about 400 MHz to prevent unacceptable levels of switching noise (relative to the operating voltage) from being propagated through power connections. The intrachip area required for a planar capacitor is so large that multiple power supplies to reduce power/performance trade-offs cannot be included on the chip since the voltage regulators cannot be adequately decoupled with the capacitors which can be provided.

Incompatible technologies have been functionally reconciled to a degree by separately forming respective circuits on semiconductor substrates by different processes and bonding the respective substrates together to form a unitary chip. Many different structures have been used for this purpose including the stacking of chips. However, when chips are stacked, interchip connections other than at edges of the chips cannot be reliably formed at minimum lithography feature size and the available area of the edges limits the number of connections which can be made. By the same token, interchip connection pitches cannot approach the fineness of intrachip connection pitches. For both of these reasons, the number of interchip connections that can be reliably formed and used is very limited and is certainly insufficient for memory capacities which can be foreseen. Connections at the edges of chips are also not optimally short to limit signal propagation time.

Accordingly, there has been no solution to providing transistors of improved performance on the same chip with trench capacitor arrays while the need for faster access time and larger numbers of storage cells and high speed logic for accessing them has not been fully answered using technologies which are compatible with each other or incompatible technologies on separately processed, commonly packaged chips. Therefore, the current state of the art does not support significant further increases in either memory capacity or performance and requires substantial processing to both align the chip faces and seal the interchip wiring from external atmosphere which could cause deterioration thereof.

SUMMARY OF THE INVENTION

It is therefore an object of the present invention to provide a single chip having both a large array of trench capacitors and high performance SOI field effect transistors in support circuits.

It is another object of the invention to provide structures allowing large trench decoupling capacitors in combination with an SOI chip.

It is yet another object of the invention to provide a layered semiconductor chip utilizing different device technologies in respective layers.

It is a further object of the invention to provide a layered semiconductor chip where the length of connections between devices in respective layers can be minimized and provided over any or all regions of the chip.

It is yet another object of the invention to provide a novel technique of laminating semiconductor chips where circuit elements have been formed on at least one of the chips at the time of lamination.

It is another further object of the invention to provide a technique of forming a semiconductor integrated circuit device in which arbitrary circuit elements can be formed consistent with a restricted heat budget for gate oxides of high performance field effect transistors.

It is yet another object of the invention to provide interchip connections at fine pitch and which are lithographically defined.

In order to accomplish these and other objects of the invention, a structure of semiconductor material is provided including a silicon layer, an insulator layer on a major surface of the silicon layer, and a monocrystalline layer overlying the insulator layer; the silicon layer and the monocrystalline layer having integrated circuit elements formed therein. Essentially, the invention provide a SOI structure with integrated circuit elements formed in the "handle" layer.

In accordance with another aspect of the invention, a method of forming a semiconductor integrated circuit is provided comprising steps of forming integrated circuit elements in a first wafer, forming an oxide layer over the circuit elements, bonding a second wafer to the oxide layer, forming integrated circuit elements at a surface of the second wafer, and forming connections from the integrated circuit elements in the second wafer to the integrated circuit elements in the first wafer. In this way, interchip connections between wafers can be lithographically defined and reliably formed in much increased numbers at pitches similar to intrachip connection pitches.

In accordance with a further aspect of the invention, a method of providing power to logic circuits formed on an SOI wafer is provided including steps of forming decoupling capacitors in a bulk silicon wafer, bonding said SOI wafer to said bulk silicon wafer, and forming lithographically defined connections between said decoupling capacitors and circuit.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
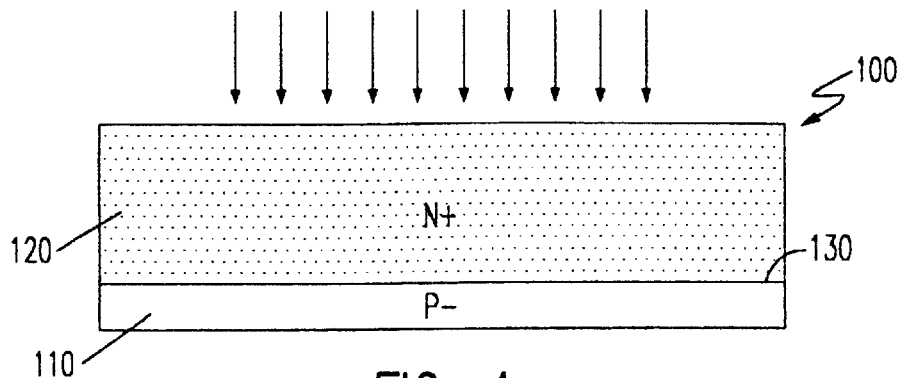
FIGS. 1, 2A, 2B, 3, 4, 5 and 6 are a sequence of cross-sectional views illustrating fabrication a first embodiment of the invention.

Referring now to the drawings, and more particularly to FIG. 1, there is shown, in cross-sectional view, a bulk silicon wafer 100, preferably of the p– type. However, it should be understood that the conductivity types of impurities are not important to the principles of the invention or the types of circuit elements integrated therein to which the invention may be applied. That is, while the invention clearly has particular applicability to dynamic memories with respect to which it will be explained and for which the illustrated conductivities are preferred, the invention is more generally directed to the formation of composite, layered, chips with optimally short and reliably formed interconnections therebetween which are lithographically defined at pitches comparable to intra chip connections while incorporating incompatible technologies.

For purposes of forming a dynamic memory array, a deep n+ implantation is performed to create a thick conductive plate layer 120 while leaving a p– region 110 and a junction 130 below it. The wafer is then annealed to remove all implant damage and a thin, high quality oxide layer is grown, followed by an oxide deposition. This oxide sequence forms a layer to be used as a hard mask for deep trench formation and for later bonding of a SOI wafer. The oxide is then patterned in any conventional manner to form the hard mask. At any convenient point in this process, alignment marks 204 are applied for later use.

Figure 2A:
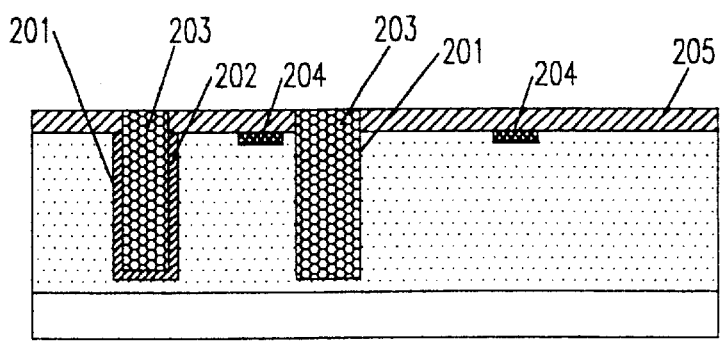

Then, as shown in FIG. 2A, deep trenches 201 are formed, preferably using the hard mask and reactive ion etching (RIE), and a capacitor dielectric 202 (e.g. grown oxide, ONO or the like) is formed to line the trenches forming the memory cell array. A photoresist block-out mask is then applied and the dielectric removed from selected deep trenches which will form capacitor plate connections where desired. The block-out mask is then removed and doped polysilicon is deposited to fill the trenches and then planarized back by polishing to the insulator 205 which also serves as a polish stop and to separate the storage nodes from the polysilicon plate interconnect(s) to thus form a dynamic storage capacitor array.

It should be appreciated that large numbers of capacitors of similar structure could be connected in parallel or other capacitor structures formed by use of the same sort of process to develop a number of capacitors of large value and suitable for decoupling capacitors or other purposes. Any portion or the entirety of the chip may be utilized for such capacitors. In the case of providing decoupling capacitors for multiple low voltage power supplies, it may be desirable to place the voltage regulators on the chip, as well.

It should also be appreciated that many other or alternative processes could be used to form a memory array or other forms of capacitors and the above processes should be regarded as exemplary and non-critical to the practice of the invention. For example, additional patterning of the insulator layer 205 could be performed and metal or polysilicon damascene interconnects could also be formed therein. Other processes to optimize the storage capacitor structure or form isolation structures could also be included.

Figure 2B:
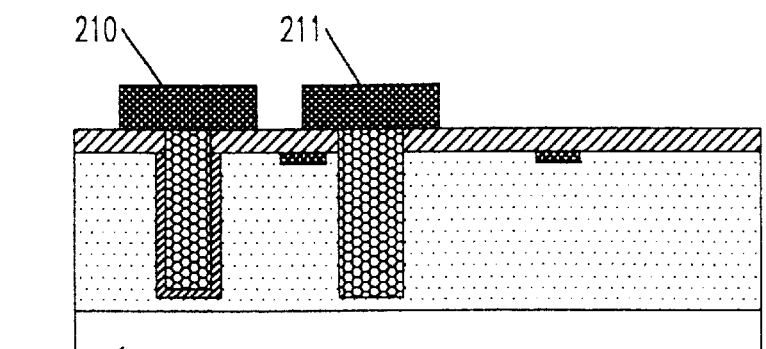

Also, as shown in FIG. 2B, temporary interconnects 210, 211 can be applied to the structure of FIG. 2A to facilitate testing and stress measurements so that the process can be continued with a memory array (or other type of die) which is "known good" and which do not require further burn-in. In this way, testing and burn-in can be isolated from other circuits which might be damaged thereby (and vice-versa). The junction diode 130 (FIG. 1) can be checked to validate the testing. Bad array segments can be identified for rework or resteering to redundant blocks or segments in any known manner.

Figure 3:
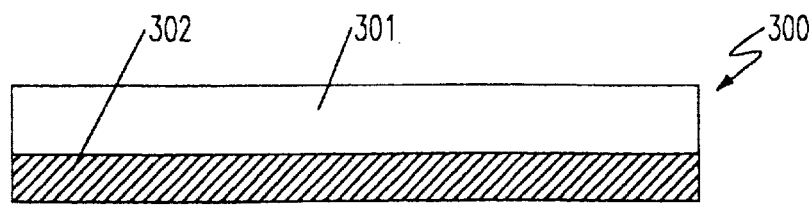
Figure 4:
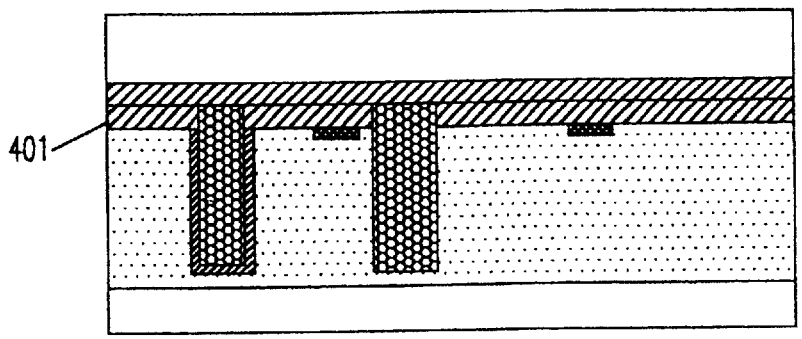

FIG. 3 shows an SOI wafer having an active region 301 and insulator 302 as may be formed by, for example, the "Smart Cut" process alluded to above or any of a variety of other methods which will be apparent to those skilled in the art, such as SIMOX (an acronym for separation by implanted oxygen) or BESOI (an acronym for bond and etch back SOI) processes. "Smart Cut" processes are preferred since the wafer processed as described above could be a by-product of that process when the SOI wafer is cleaved therefrom. (The orientation of SOI wafer 300 as shown in FIG. 3 is inverted from the orientation in which it would have been cleaved from wafer 100 of FIG. 1 and further oxidation of layer 302 would have been performed. FIG. 4 shows this SOI wafer bonded to the integrated circuit structure of FIG. 2A at interface 401.

The SOI wafer of FIG. 3 can be prepared in situ on the bulk silicon wafer in accordance with the "Smart Cut" process. In this case, a second wafer is implanted with hydrogen and an oxide is deposited and/or grown thereon and bonded to the oxide layer 205 of the wafer of FIG. 2A. Upon low temperature heat treatment, the second wafer is cleaved in accordance with the "Smart Cut" process, leaving a thin monocrystalline silicon layer on the composite oxide layer 205, 302. The cleaved silicon surface may then be polished to complete the SOI structure with the integrated circuit of FIG. 2B serving as the support layer that would ordinarily be merely bulk silicon. It should be noted that no alignment is required during the bonding process since no structures have yet been formed of the SOI wafer.

Figure 5:
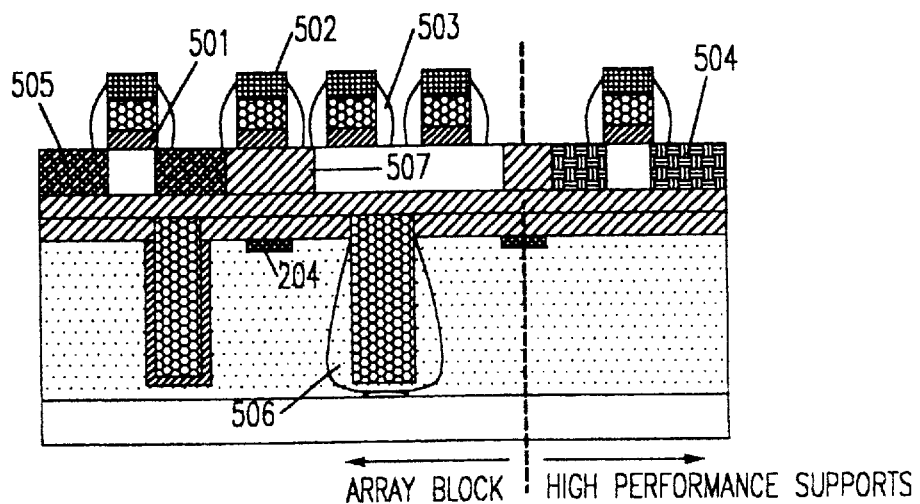

As shown in FIG. 5, standard transistor fabrication may now be performed on the SOI active layer in accordance with alignment marks 204. For example, gate oxide regions 501 are grown and patterned and gate electrodes 502, preferably but optionally capped with nitride (to provide a borderless bit line contact) are applied. Sidewall spacers 503 may then be added in a self-aligned fashion. Several active regions 504, 505 may be provided (e.g. for array switching and support circuit regions which may require transistors having different properties. Isolation and insulation regions 507 are also formed by processes which will be evident to those skilled in the art, particularly to surround capacitor plate connections which are advantageously enhanced by diffusion 506 during the heat treatment of the bonding process. The area of the trench capacitors is not limited, as shown in FIG. 5, since the capacitors are formed independently of the SOI layer, as described above, and may extend laterally under the MOSFETs even if the capacitors are storage capacitors for memory cells. Such an increase in lateral dimensions may reduce criticality of alignment during bonding, as well as providing the potential for increased memory cell storage capacitance.

It should also be noted that the interchip connection pitch to these capacitors and other circuits on the bulk wafer from the SOI wafer are lithographically defined and can be at pitches comparable to the intrachip connections on the SOI chip, allowing the number of interchip connections to be greatly increased. In addition, the number of interchip connections can be greatly increased, such connections may be utilized to partition the memory array more effectively to reduce bit line and word line length and capacitance; increasing operating margins of the memory (especially at the sense amplifiers) and/or reducing the required minimum operating voltage. Increased numbers of interchip connections also allow for sufficient numbers of them to be used for low resistance power supply connections and reduction of the need for larger connections to be provided.

Figure 6:
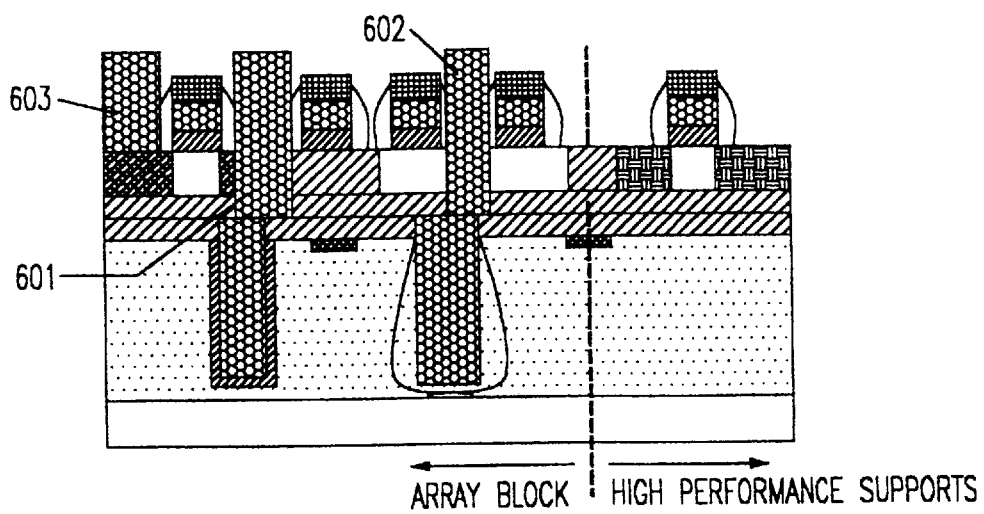

Then, as shown in FIG. 6, the composite, layered, chip is completed by patterning the SOI wafer and insulators formed thereon to the deep trench structures 203 and forming conductors 601, 602 and 603 of metal or polysilicon. It should be noted that the array transistors are connected to storage nodes of the memory array simply by short vias formed as a portion of connection 601. The plate connection is also a via formed by part of connection 602. Surface array connections such as word lines are provided by connections 603 to the transistors.

Figure 7:
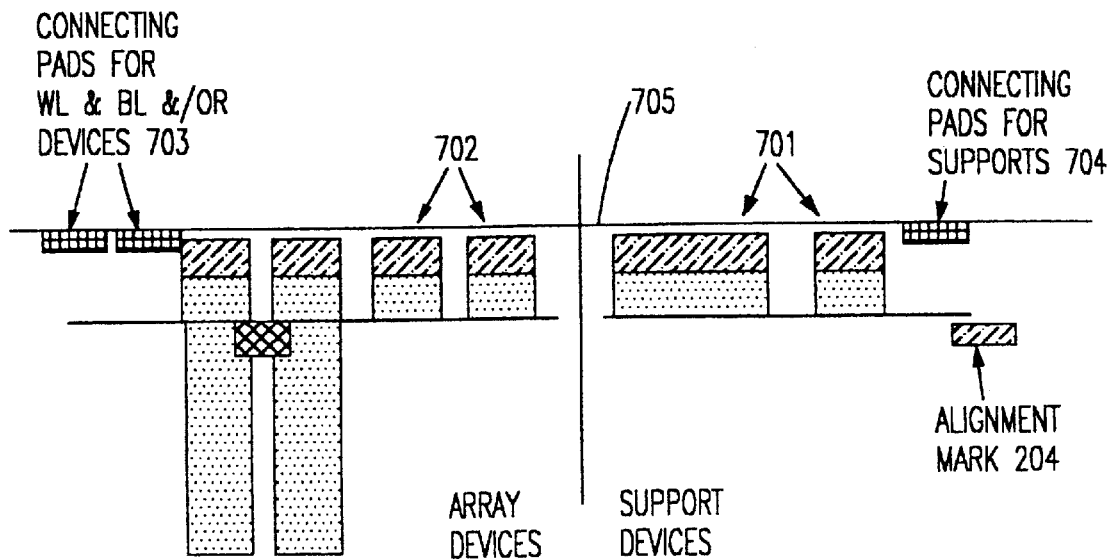
FIGS. 7, 8, 9, 10 and 11 are a sequence of cross-sectional views illustrating fabrication a second embodiment of the invention.

A second embodiment of the invention will now be described with reference to FIGS. 7–11. FIG. 7 shows a wafer at a stage of fabrication similar to that of FIG. 2A, described above and formed in substantially the same manner. However, FIG. 7 differs from FIG. 2A by inclusion of support devices 701 and array devices 702 which can be formed on the same substrate by processes compatible with the formation of the memory cell array. Alignment marks 204 are provided as described above. Additionally, while connections within and between the array and support sections, it will generally be found convenient to provide connection pads 703, 704 at the surface 705 of a planarized insulator (passivation) layer.

Figure 8:
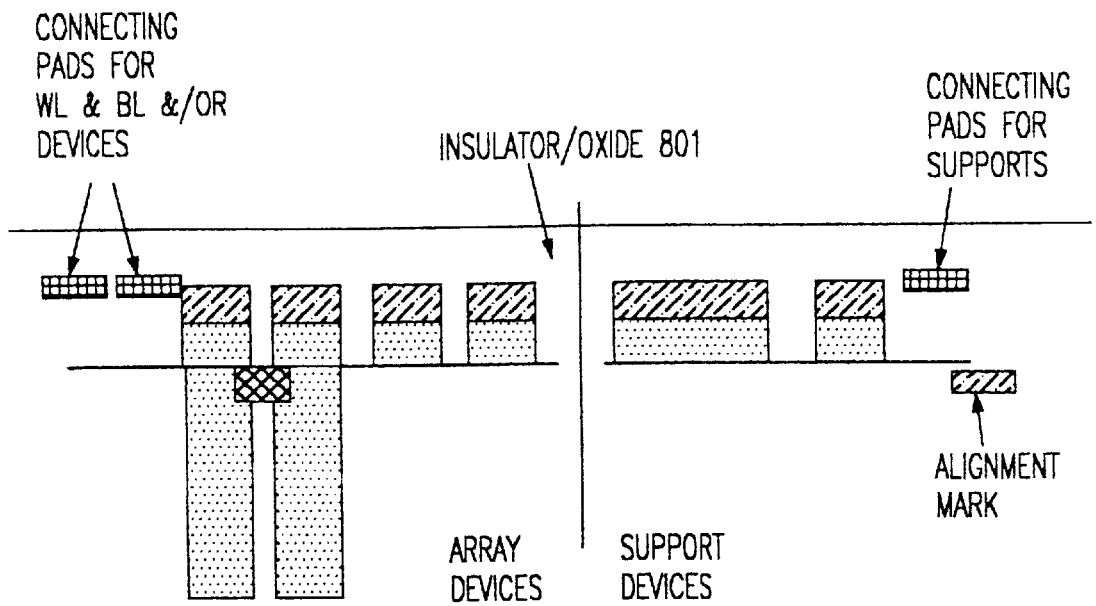
Figure 9:
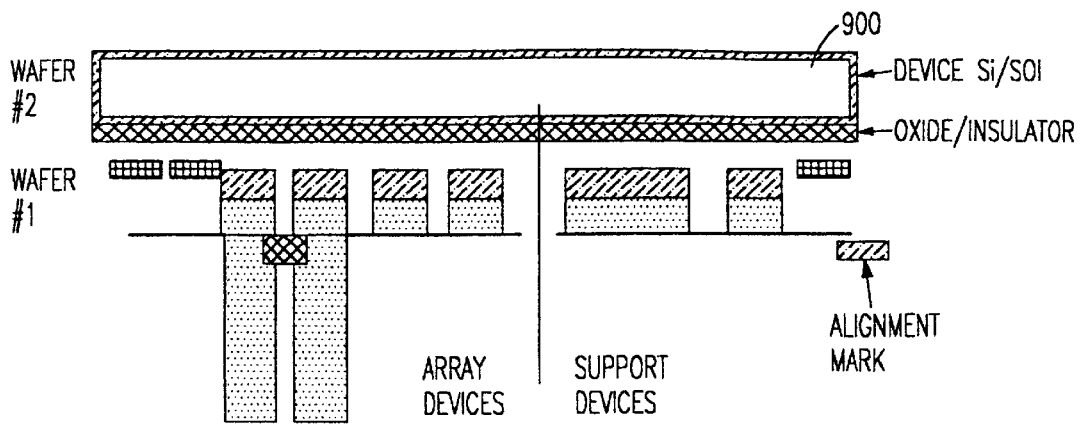

As shown in FIG. 8, an insulator/oxide 801 is deposited and a SOI wafer is bonded thereto by processes such as those described above as shown in FIG. 9. High performance devices can then be formed on and/or in the SOI active layer and connections 901 formed to connection pads 703 (and/or 704) in the manner described above in connection with FIGS. 5 and 6. Connections may also be formed to other structures or connections in or on the bulk silicon wafer layer if desired.

Figure 10:
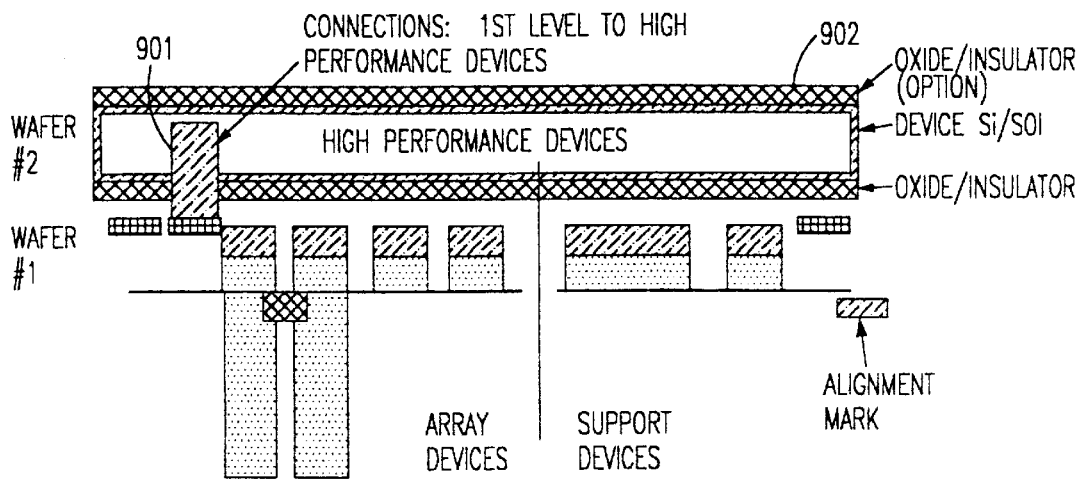
Figure 11:
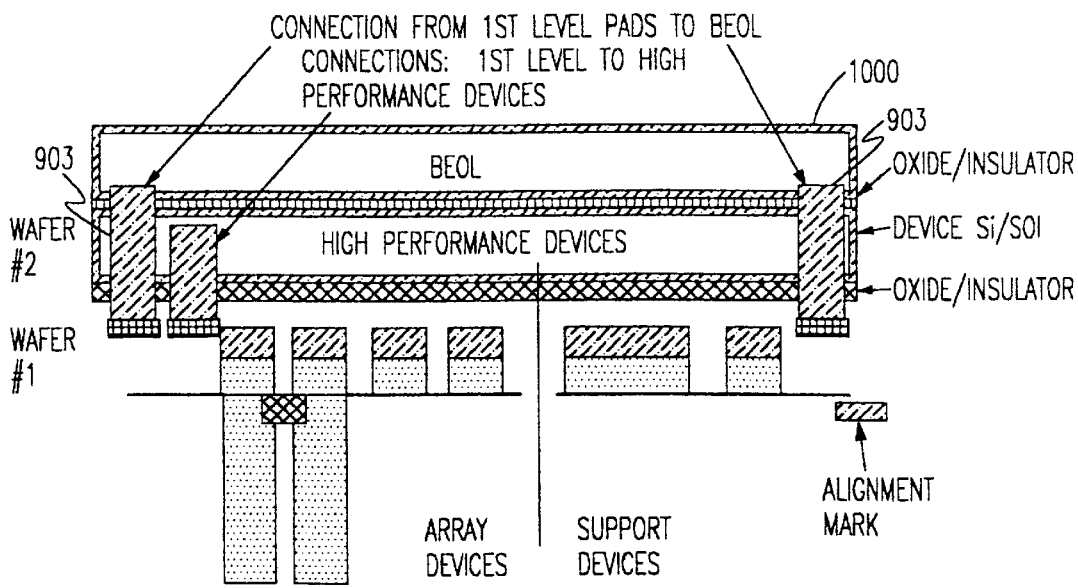

Optionally, an additional oxide/insulator layer 902 may be provided. If all desired circuit elements and connections have been formed and the device shown in FIG. 10 is substantially complete, such a layer serves as a passivation layer. If, however, even greater complexity and functionality is desired, oxide/insulator layer 902 can serve to bond another wafer 1000 thereto after formation of via connections to other connection pads 703. This further wafer may be another SOI structure, a bare bulk silicon wafer or any other desired wafer structure.

If wafer or chip 1000 includes devices which require heat treatment beyond that which can be withstood by the devices in wafer 900, they can be fabricated on wafer or chip 1000 prior to bonding although accurate alignment for bonding will be required. However, the cost of such an alignment process is more than offset by the benefits of providing short connections to underlying chips and the ability to use technologies which may be incompatible with those on underlying wafers or chips. This process of laminating of chips can be continued, at will and provides substantial design freedom as well as the capability to provide substantially unlimited integrated circuit complexity and functionality while supporting levels of performance not otherwise attainable by the short connections which can thus be provided.

While the invention has been described in terms of a single preferred embodiment, those skilled in the art will recognize that the invention can be practiced with modification within the spirit and scope of the appended claims.

What is claimed is:

1. A method of forming a semiconductor integrated circuit, comprising the steps of:

forming an oxide layer on a first wafer;

forming trenches through said oxide layer and extending into said first wafer;

forming an insulator within a said trench;

filling said trenches with a conductive material;

bonding a second wafer to said oxide layer;

forming integrated circuit elements of a second type at a surface of said second wafer directly; and forming connections from said integrated circuit elements of a second type in said second wafer to said conductive material in a trench in said first wafer.

2. A method as recited in claim 1, wherein said second wafer is formed by the steps of:

implanting hydrogen in said first wafer from a first surface;

forming an oxide on said first surface of said first wafer; and cleaving said second wafer from said first wafer at a location of hydrogen implanted therein prior to said step of forming integrated circuit elements in said first wafer.

3. A method as recited in claim 2, including a step of polishing a surface of said second wafer cleaved from said first wafer.

4. A method as recited in claim 1, further including a step of testing or burn-in of circuit elements formed in said first wafer prior to said bonding step.

5. A method as recited in claim 1, further including a step of testing or burn-in of circuit elements formed at a surface of said second wafer prior to said bonding step.

6. A method as recited in claim 4, further including a step of testing or burn-in of circuit elements formed at a surface of said second wafer prior to said bonding step.

7. A method as recited in claim 1, including the further step of connecting selected circuit elements formed in said first wafer in parallel.

8. A method as recited in claim 1, wherein said step of forming connections is defined lithographically.

9. A method as recited in claim 8, wherein some of said connections to said first wafer are formed at a pitch similar to intrachip connections between circuit elements formed at a surface of said second wafer.

10. A method of providing power to logic circuits formed on an SOI wafer, said method including steps of:

forming an oxide layer on a bulk silicon wafer;

forming trenches through said oxide layer and extending into said first wafer;

forming an insulator within a said trench;

filling said trenches with a conductive material;

bonding said SOI wafer directly to said oxide layer on said bulk silicon wafer; and forming lithographically defined connections between said conductive material in a trench and circuit elements on said SOI wafer.

11. A method as recited in claim 1 wherein said step of forming an insulator comprises growing an oxide.

12. A method as recited in claim 10 wherein said step of forming an insulator comprises growing an oxide.

* * * * *